United States Patent [19]
Suzuki

[11] Patent Number: 5,990,530
[45] Date of Patent: Nov. 23, 1999

[54] RAISED SEMICONDUCTOR MOS TRANSISTOR WITH IMPROVED TRANSISTOR CHARACTERISTICS

[75] Inventor: Hisamitsu Suzuki, Tokyo, Japan

[73] Assignee: NEC Corporation, Tokyo, Japan

[21] Appl. No.: 08/892,028

[22] Filed: Jul. 14, 1997

[30] Foreign Application Priority Data

Jul. 15, 1996 [JP] Japan ................................ 8-184426

[51] Int. Cl.⁶ .................................................. H01L 27/01
[52] U.S. Cl. ......................... 257/408; 257/344; 257/336; 257/355; 257/377; 257/382; 257/383; 257/384; 257/385; 257/408
[58] Field of Search .................................. 257/335, 336, 257/344, 342, 374, 377, 382–385, 408, 355

[56] References Cited

U.S. PATENT DOCUMENTS 5,627,395   5/1997   Witek et al. ............................ 257/263

OTHER PUBLICATIONS

Imai et al., "0.15μm Delta–doped CMOS with On–field Source/Drain Contacts", 1996 Symposium on VLSI Technology Digest of Technical Papers, pp. 172–173.

*Primary Examiner*—Fetsum Abraham
*Attorney, Agent, or Firm*—Sughrue, Mion, Zinn, Macpeak & Seas, PLLC

[57] ABSTRACT

A semiconductor device including a semiconductor substrate having thereon an element region having a surface, an element separating insulating film having an upper surface adjacent to opposing lateral sides of the element region, a silicon epitaxial layer having an upper surface formed on the surface of the element region, a polysilicon layer having an upper surface formed on the element separating film and connected to the silicon epitaxial layer, a gate insulating film and a gate electrode formed on the silicon epitaxial layer, and impurity doped source and drain regions formed in the silicon epitaxial layer. Furthermore, the upper surface of the silicon epitaxial layer is higher than or at the same level as the upper surface of the polysilicon layer. This is done by forming the polysilicon layer on a recessed portion of the element separating insulating film adjacent to the element region. The above prevents the occurrence of overhanging structures which would otherwise partially block the source and drain implant and result in a high resistance region.

14 Claims, 12 Drawing Sheets

RAISED SEMICONDUCTOR MOS TRANSISTOR WITH IMPROVED TRANSISTOR CHARACTERISTICS

BACKGROUND OF THE INVENTION

1. Field of the Invention

The present invention relates to a semiconductor device and, particularly, to a MOS type transistor structure and a method of fabricating the same.

2. Description of the Related Art

With the ongoing miniaturization of transistors, an improvement in operating speed has been proposed. Recently, a MOS type transistor having a gate length of 0.25 $\mu$m or smaller was developed. However, in contrast to such a shortened gate length, 1) the contact size, 2) the distance between the contact and gate, and 3) the distance between the contact and an element separating insulating film cannot be reduced correspondingly, and it becomes difficult to reduce the area of the source and drain diffusion layers. As a result, the ratio of the charge/discharge time of the source and drain diffusion layer capacitance to the operating speed of the transistor becomes larger, and this prevents an increase in the operating speed of the device. A method for solving this problem is proposed by Imai et al., 0.15 $\mu$m Delta-doped CMOS with On-field Source/Drain Contacts, 1996 Symposium on VLSI Technology Digest of Technical Papers, Jun. 11–13, 1996/Honolulu, pgs. 172–173.

The structure of a MOS transistor according to Imai et al. and a fabrication method thereof is briefly described below with reference to the drawings.

Figure 6A:
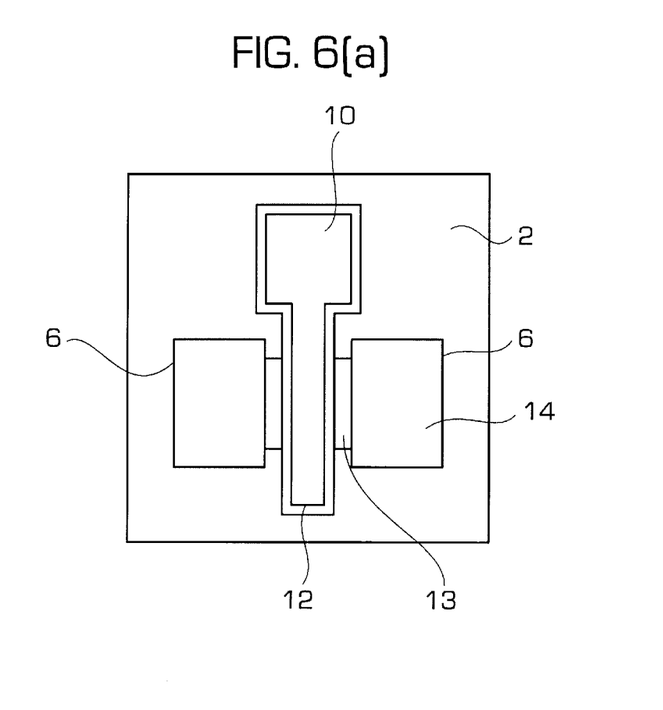
FIGS. 6(a) and 6(b) are a plan view and a cross sectional view illustrating a conventional transistor.
Figure 6B:
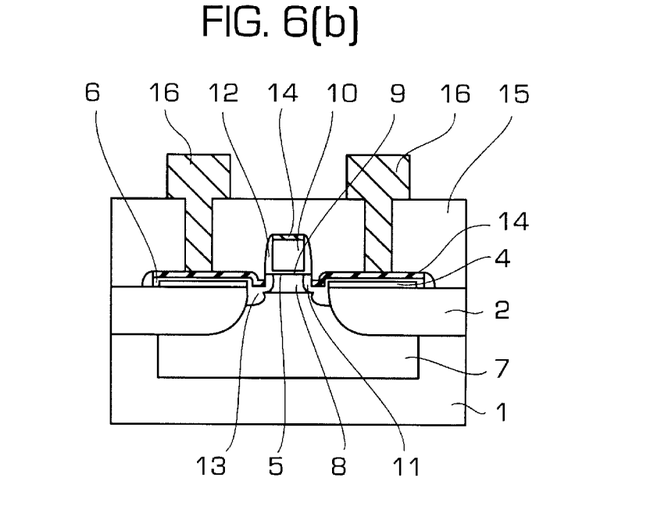

First, the structure of the MOS transistor according to the related art is described by utilizing the plan layout of FIG. 6(a) and the cross sectional structure of FIG. 6(b).

As shown in FIG. 6(b), the structure of the MOS transistor according to the related art includes, on a silicon substrate of a first conductivity type, a well region 7 of the first conductivity type or a conductivity type opposite to the first conductivity type. On a surface of a portion of the silicon substrate 1 in which the well region 7 is formed, MOS transistors are formed which are electrically separated by an element separating insulating film 2.

On the surface of the portion of the silicon substrate 1 in which the well region 7 is formed, there is a selective silicon epitaxial layer 5 and a gate oxide film 9 on which a gate electrode 10 is formed.

An LDD side wall 12 and a TiSi (titanium silicide) layer 14 are formed on a side surface and an upper surface of the gate electrode 10, respectively.

The selective silicon epitaxial layer 5 is connected to a first polysilicon layer 4 and a selective polysilicon layer 6 which are formed in lamination, and these layers form a channel dope layer 8, a LDD (lightly doped drain) region 11 and source and drain regions 13 of the MOS transistor, respectively.

Furthermore, the channel dope layer 8 is formed immediately below the gate electrode 10, the LDD region 11 is formed immediately below the LDD side wall 12, and the source and drain regions 13 are formed between an outside of the LDD side wall and the element separating insulating film.

Furthermore, a TiSi layer 14 is formed on a surface of the selective polysilicon layer 6, an inter-layer insulating film 15 is formed on a whole surface of the wafer substrate, and contacts provided therein are connected to the source and drain electrodes as lead electrodes 16 of the source and drain, respectively.

FIGS. 7(a)–7(c), 8(a)–8(c) and 9(a)–9(c) show the steps of fabricating the MOS transistor according to the related art.

Figure 7A:
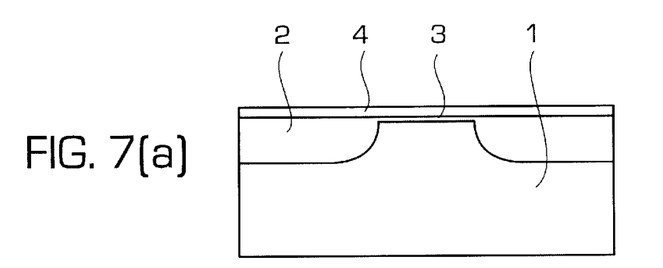
FIGS. 7(a)–7(c) are a plan view and a cross sectional view illustrating a method for fabricating the conventional transistor.

First, as shown in FIG. 7(a), an insulating film 2 for separating elements is formed on the silicon substrate 1 and, then, a silicon oxide film 3 having thickness of 5–20 nm is formed thereon. Furthermore, a first polysilicon layer 4 having thickness of 50–100 nm is grown on the whole surface of the substrate.

Figure 7B:
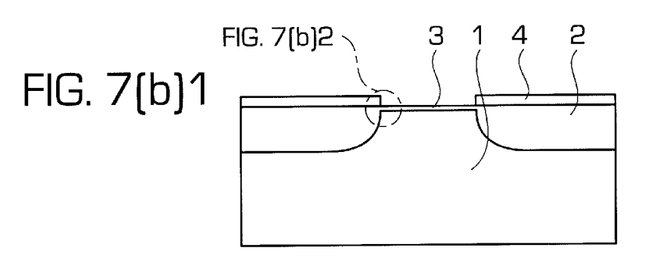
Figure 7C:
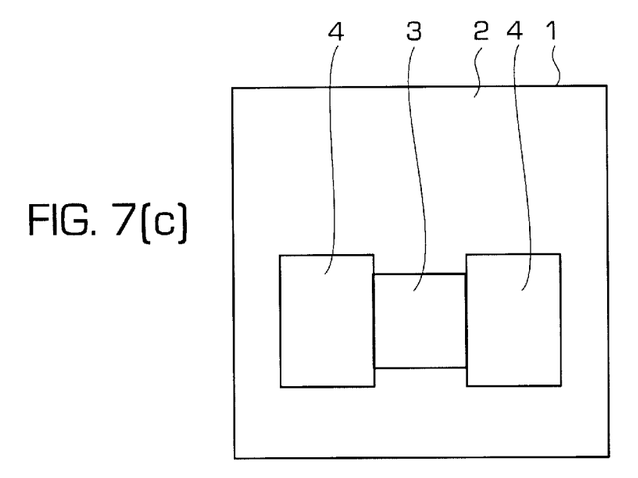

Then, as shown in FIG. 7(b), the first polysilicon layer 4 is patterned by a photolithographic technique. In this case, the first polysilicon layer 4 is patterned on the element separating insulating film 2 such that it is adjacent to the source and drain regions along the element region in which the transistor is formed with the element separating oxide film 2 and in parallel (same distance) to the gate electrode 10, as shown in the plan view in FIG. 9(b). In this case, an edge of the first polysilicon layer 4 is set 0–0.1 $\mu$m inside the edge of the element separating insulating film 2. Also, the silicon oxide film 3 functions as a stopper in etching the first polysilicon layer 4.

Figure 8A:
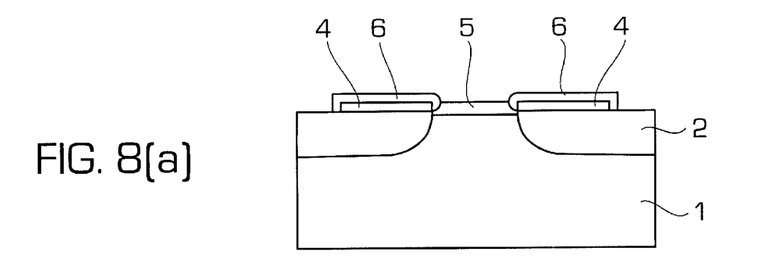
FIGS. 8(a)–8(c) are a plan view and a cross sectional view illustrating a method of fabricating the conventional transistor.
Figure 8B:
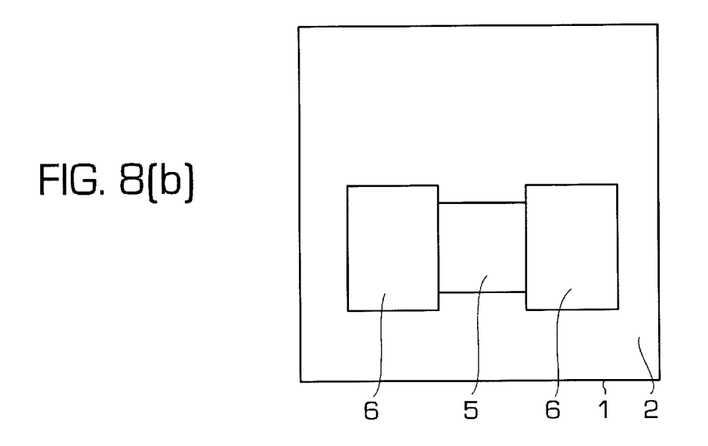

Then, as shown in the cross section in FIG. 8(a) and the plan view in FIG. 8(b), after the silicon oxide film 3 is removed using, for example, a wet etching liquid, a silicon epitaxial layer 5 is selectively grown on the exposed surface of the silicon substrate 1. The thickness of the silicon epitaxial layer 5 is 30–100 nm. Simultaneously therewith, a selective polysilicon layer 6 is grown on the surface and periphery of the first polysilicon layer 4. The thickness of the selective polysilicon layer 6 grown on the first polysilicon layer 4 is on the order of ½ to ¼ the thickness of the silicon epitaxial layer 5. The reason for this is that the surface of the silicon substrate is a <100> plane. On the other hand, a <111> plane orientation is predominant for polysilicon, and silicon grows slower in a <111> plane as compared to a <100> plane. The silicon epitaxial layer 5 selectively grown on the surface of the silicon substrate 1 can be connected to the side surface of the first polysilicon layer 4 and the selective polysilicon layer 6.

Figure 8C:
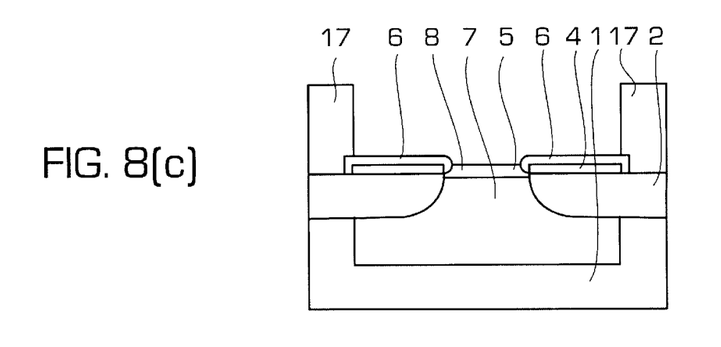
Figure 9A:
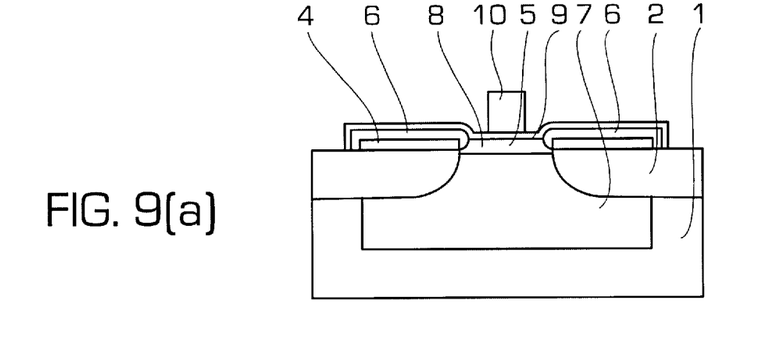
FIGS. 9(a)–9(c) are a plan view and a cross sectional view illustrating a method of fabricating the conventional transistor.
Figure 9B:
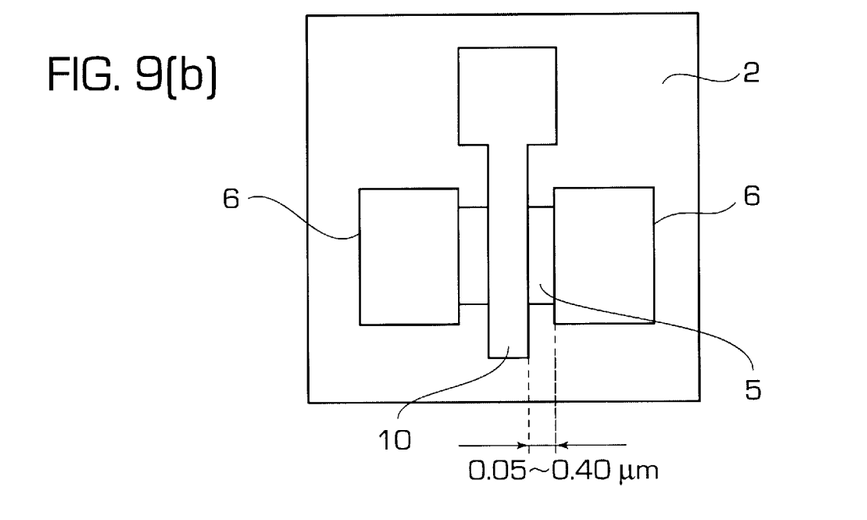

Then, as shown in FIG. 8(c), a well region 7 is formed by ion implantation using photoresist 17 as a mask and, thereafter, a channel dope layer 8 is formed by ion implantation to achieve a threshold value control. Then, as shown in FIG. 9(a), after a gate oxide film 9 having a thickness of 3–10 nm is formed on the surfaces of the silicon epitaxial layer 5 and the selective silicon layer 6, a polysilicon gate electrode 10 having a thickness of 10–20 nm is formed on the gate oxide film 9. In this case, the distance between the gate electrode 10 and the element separating insulating film 2 is set on the order of 0.05–0.4 $\mu$m, as shown in the plan view in FIG. 9(b).

Figure 9C:
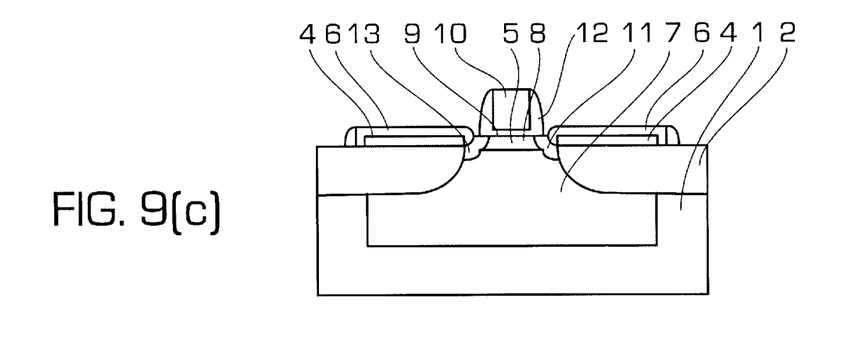

Then, as shown in FIG. 9(c), after an LDD region 11 is formed by implanting an impurity at low concentration, a side wall 12 is formed on the side surface of the gate electrode and, after the source and drain regions are formed by ion implantation, the source and drain regions 13 are activated by heat treatment. Thereafter, as shown in FIG. 6(b), a silicide film, in this case, a TiSi film, is formed by sputtering and, after sintering, the surface of the gate electrode 10, the surfaces of the selective polysilicon layer 6 and the surface of the first polysilicon layer 4 located below the selective polysilicon layer 6 and the surface of the source and drain regions 13 are silicided. Then, after an inter-layer insulating film 15 is formed and opened, the MOS type transistor is completed by forming the respective lead electrodes 16 through the openings.

Figure 10A:
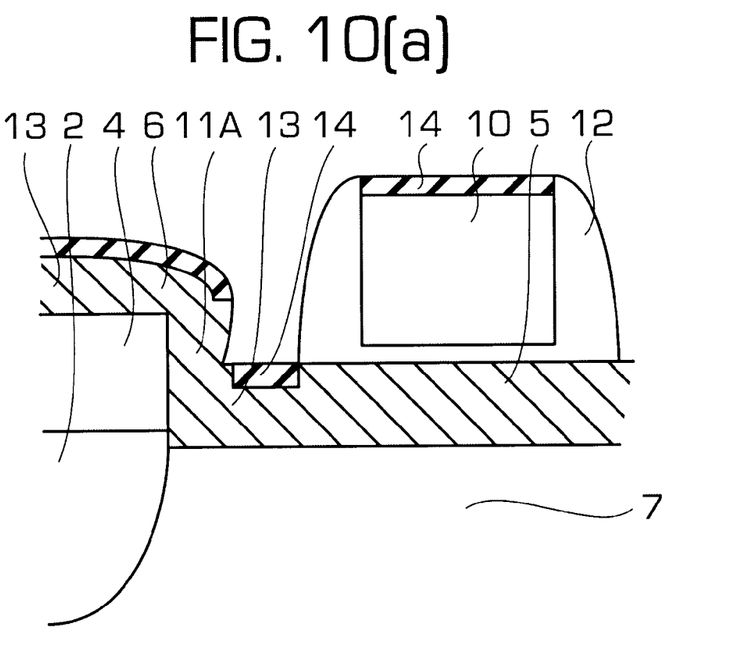
FIG. 10 shows cross sectional views which illustrate the problems of a conventional transistor structure.
Figure 10B:
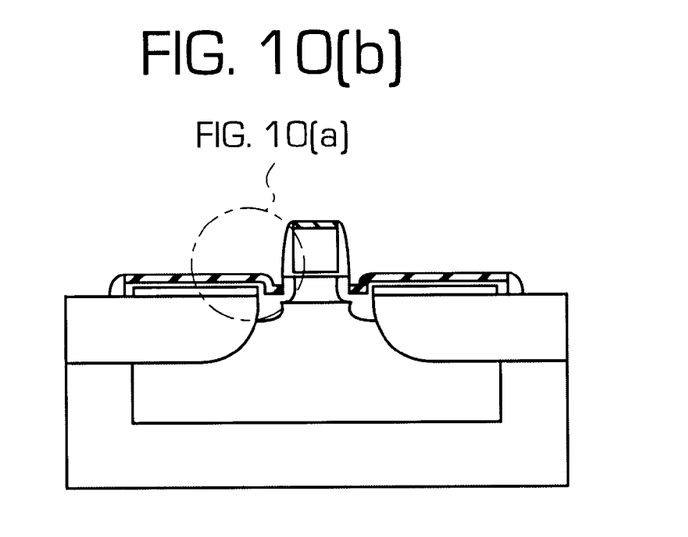
Figure 11A:
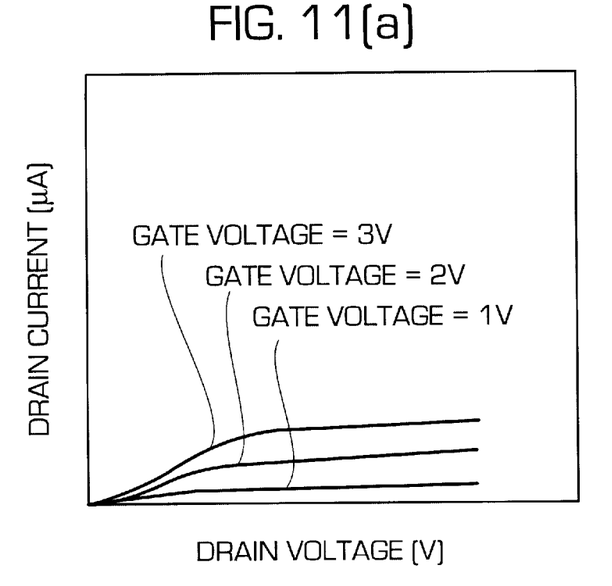
FIGS. 11(a) and 11(b) are the transistor characteristics of a conventional structure and the transistor characteristics of an embodiment of the present invention, respectively.

In FIG. 8(a) which shows the embodiment of the related art mentioned above, in growing the silicon epitaxial layer 5 selectively on the surface of the silicon substrate 1, the selective polysilicon layer 6 grown on the surface of the first polysilicon layer 4 and covering the first polysilicon layer 4 may have an overhanging cross section as shown in FIG. 10. In forming the source and drain regions 13 by implanting an impurity at a high concentration (e.g., at a dose of about $1 \times 10^{16}/cm^2$), a high resistance region 11A may occur because the ion implantation is partially blocked by the overhanging structure. The resulting transistor characteristics are degraded as shown in FIG. 11(a) due to the high resistance of this region.

SUMMARY OF THE INVENTION

Figure 11B:
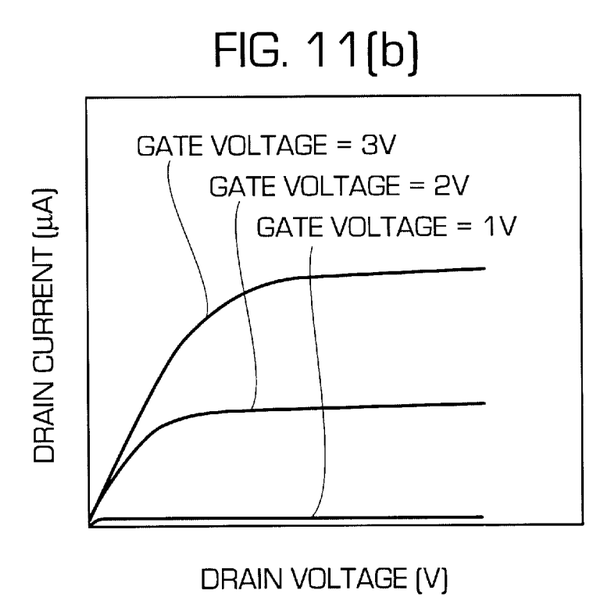

It is therefore an object of the present invention to prevent the selective polysilicon layer 6 from having a cross section which overhangs the edge of the first polysilicon layer 4, to thereby provide good transistor characteristics as shown in FIG. 11(b).

The above objective of the present invention has been achieved by providing a semiconductor device comprising a semiconductor substrate having thereon an element region having a surface, an element separating insulating film having an upper surface adjacent to opposing lateral sides of said element region, a silicon epitaxial layer having an upper surface formed on the surface of said element region, a polysilicon layer having an upper surface formed on said element separating film and connected to said silicon epitaxial layer, a gate insulating film and a gate electrode formed on said silicon epitaxial layer, and impurity doped source and drain regions formed in said silicon epitaxial layer, wherein the upper surface of said silicon epitaxial layer is higher than or at the same level as the upper surface of said polysilicon layer.

The above object of the invention has also been achieved by providing a semiconductor device comprising a semiconductor substrate having thereon an element region, an element separating insulating film adjacent to opposing lateral sides of said element region, a first silicon epitaxial layer formed on said element region, a second silicon epitaxial layer having an upper surface formed on said first silicon epitaxial layer, a polysilicon layer including an upper surface formed on said element separating film and connected to said second silicon epitaxial layer, a gate insulating film and a gate electrode formed on said second silicon epitaxial layer, and impurity doped source and drain regions formed in said second silicon epitaxial layer, wherein the upper surface of said second silicon epitaxial layer is higher than or at the same level as the upper surface of said polysilicon layer.

The above object of the present invention has also been achieved by providing a semiconductor device comprising a semiconductor substrate having thereon an element region, an element separating insulating film adjacent to opposing lateral sides of said element region, a silicon epitaxial layer having an upper surface formed on said element region, a first polysilicon layer formed on said element separating film, a second polysilicon layer having an upper surface formed on said first polysilicon layer and connected to said silicon epitaxial layer, a gate insulating film and a gate electrode formed on said silicon epitaxial layer, and impurity doped source and drain regions formed in said silicon epitaxial layer, wherein the upper surface of said silicon epitaxial layer is lower than the upper surface of said second polysilicon layer, the first polysilicon layer has a tapered edge adjacent the element region, and the bottom of the first polysilicon layer is closer to the element region than the top of the first polysilicon layer.

It is possible to provide a selective polysilicon layer grown on the surface of the first polysilicon layer having a surface position that is the same as or lower than a surface position of the selective epitaxial layer during growth of the selective epitaxial layer. This is done by forming the first polysilicon layer on a portion of the surface of the element separating insulating film adjacent to the element region that is recessed, or by making the surface of the element region higher than the surface of the element separating insulating film, to thereby prevent the selective polysilicon layer from having a cross section which overhangs the edge of the first polysilicon layer.

Furthermore, by forming the first polysilicon layer having a tapered edge adjacent the element region and a cross section such that the bottom of the layer is closer to the element region than the top of the layer, it is possible to prevent the selective polysilicon layer from overhanging. This is the case even when the surface level of the selective polysilicon layer grown on the surface of the first polysilicon layer is higher than the surface level of the selective epitaxial layer.

In view of the above, it is possible to prevent the formation of a high resistance region where ion implantation is partially blocked by the overhanging portion in the SD implant for source and drain formation. As a result, it is possible to obtain good transistor characteristics.

DETAILED DESCRIPTION OF THE INVENTION

First, a structure of a MOS transistor according to a first embodiment of the present invention is described below with reference to a plan view layout and a cross sectional structure thereof.

Figure 1A:
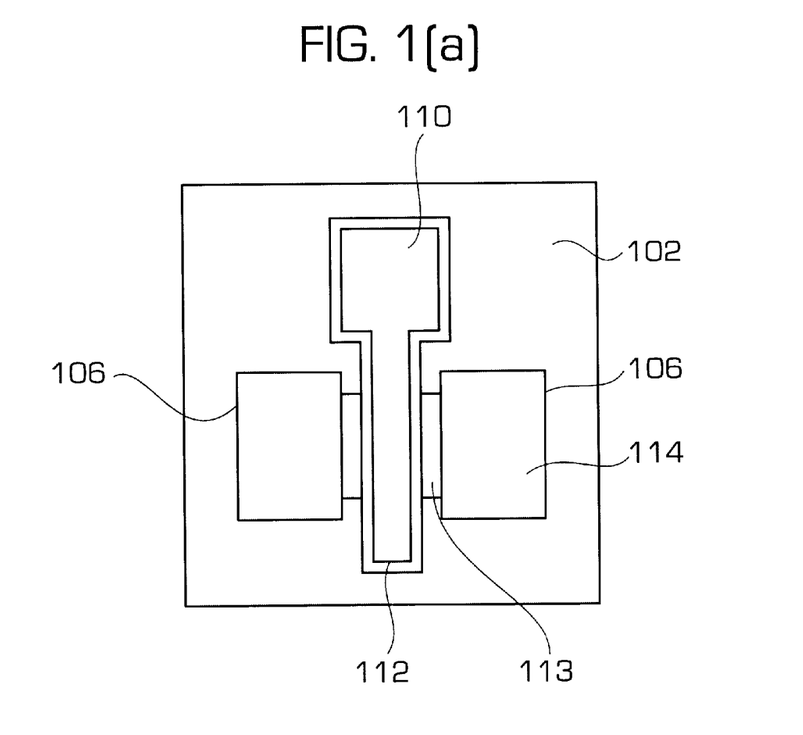
FIGS. 1(a) and 1(b) are a plan view and a cross sectional view illustrating a first embodiment of the present invention.
Figure 1B:
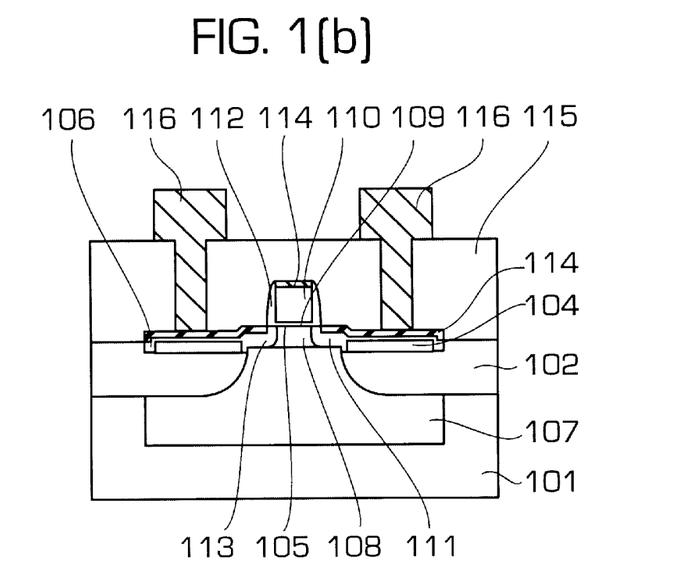

FIGS. 1(a) and 1(b) show a plan view layout and a cross sectional structure of a MOS transistor according to a first embodiment of the present invention, respectively.

On a silicon substrate 101 of a first conductivity type, a well region 107 of the first conductivity type or an opposite conductivity to the first conductivity type is provided. On a surface of the silicon substrate 101 of the well region 107, MOS transistors are formed, which are electrically separated by an element separating insulating film 102.

On a surface of the silicon substrate 101 of the well region 107, a selective silicon epitaxial layer 105 is provided and a gate electrode 110 is provided through a gate oxide film 109.

A LDD side wall 112 and a TiSi (titanium silicide) layer 114 are provided on a side surface and an upper surface of the gate electrode 110, respectively.

The selective silicon epitaxial layer 105 is connected to a first polysilicon layer 104 and a selective polysilicon layer 106 which are formed in lamination. The surface of the selective silicon epitaxial layer 105 is higher than or at the same level as a surface of the selective polysilicon layer 106. The selective silicon epitaxial layer 105 includes a channel doped layer 108, a LDD region 111 and source and drain regions 113 of the MOS transistor.

Furthermore, the channel doped layer 108, the LDD region 111 and the source and drain regions 113 are formed immediately below the gate electrode 110, immediately below the LDD side wall 112 and between an outside of the LDD side wall 112 and the element separating insulating film, respectively.

Furthermore, the TiSi layer 114 is formed on the surface of the selective polysilicon layer 106, the inter-layer insulating film 115 is formed on the whole surface of the wafer substrate and contacts provided in the inter-layer insulating film are connected to the source and drain electrodes as lead electrodes 116 of the source and drain, respectively.

Figure 2A:
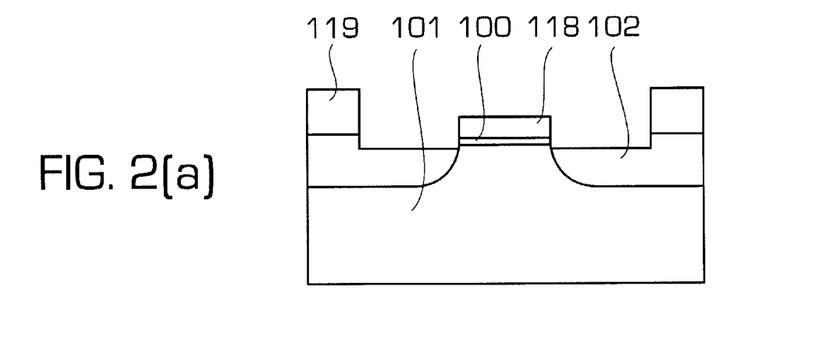
FIGS. 2(a)–2(c) are cross sectional views illustrating the steps for fabricating the transistor shown in FIGS. 1(a) and 1(b).
Figure 2B:
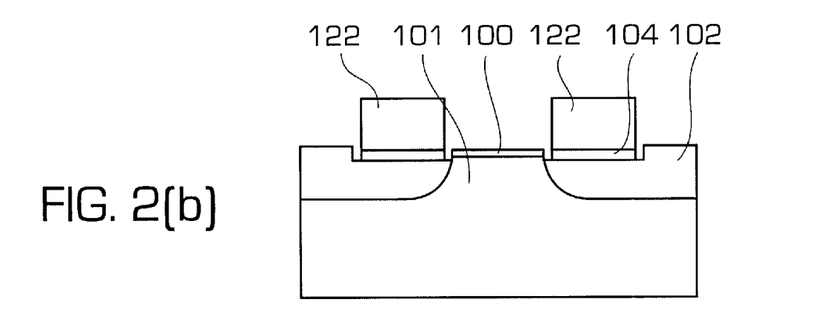
Figure 2C:
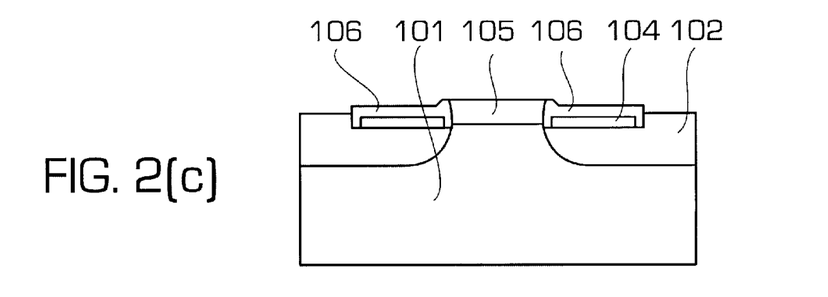
Figure 3A:
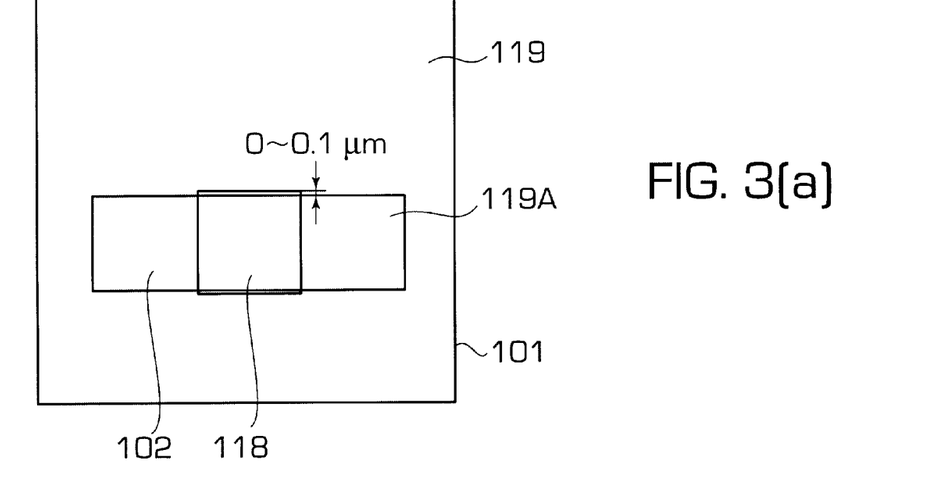
FIGS. 3(a) and 3(b) are plan views illustrating a method of fabricating the transistor shown in FIGS. 2(a)–2(c) in detail.
Figure 3B:
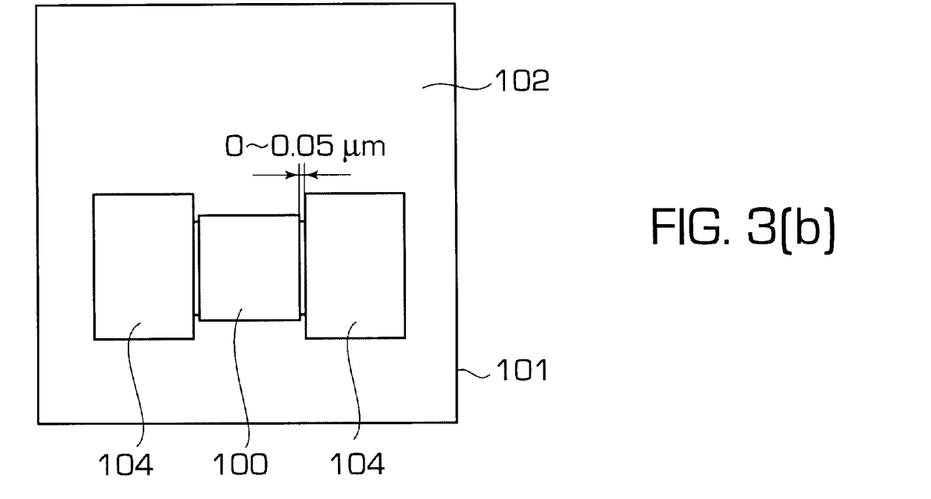

FIGS. 2(a)–2(c) are cross sections of a fabrication method of the MOS transistor according to a first embodiment of the present invention and FIGS. 3(a) and 3(b) are plan view layouts of FIGS. 2(a) and 2(b), respectively.

First, as shown in FIG. 2(a), a first silicon oxide film 100 having thickness of 5–20 nm and a nitride film 118 having thickness of 10–40 nm are selectively formed on the silicon substrate 101 and then an insulating film 102 for element separation is formed by a known method. Then, the oxide film in an opening region formed by photoresist 119 is selectively removed by an amount corresponding to a thickness of 50–100 nm.

FIG. 3(a) shows a plan view layout in this case. As shown in FIG. 3(a), the photoresist is opened over the nitride film 118 and the element separating oxide film 102 as shown by 119A, and is set 0–0.1 μm inside the gate width.

Then, as shown in FIG. 2(b), after the photoresist 119 and the nitride film 118 are removed, a first polysilicon layer 104 having thickness of 50–100 nm is grown and patterned by a photoresist 122. In this case, the first polysilicon layer 104 is patterned on the element separating insulating film 102 in such manner that, as shown in the plan view in FIG. 3(b), it extends along a border between the element separating insulating film 102 and the element region forming the transistor, is adjacent to the source and drain forming regions and is in parallel (same distance) to the subsequently formed gate electrode 110. In this case, an edge of the first polysilicon layer 104 is set 0–0.05 μm outside an edge of the element separating insulating film 102. Also, the silicon oxide film 100 and the element separating insulating film 102 function as a stopper in etching the first polysilicon layer 104.

Then, as shown in FIG. 2(c), after the silicon oxide film 100 is removed by using, for example, a wet etching liquid, etc., the selective silicon epitaxial layer 105 is selectively grown on the surface of the silicon substrate 101. The resulting thickness of the grown film is 30–100 nm, and the selective polysilicon layer 106 is grown on the surface and a periphery of the first polysilicon layer 104. The film thickness of the selective polysilicon layer 106 grown on the first polysilicon layer 104 is on the order of ½ to ¼ of the thickness of the selective silicon epitaxial layer 105 grown on the silicon substrate 101. The reason for this is that the surface of the silicon substrate is a <100> plane. On the other hand, a <111> plane orientation is predominant for polysilicon, and the growth rate of silicon in a <111> plane is low. The selective silicon epitaxial layer 105 selectively grown on the surface of the silicon substrate 101 can be connected to the side surface of the first polysilicon layer 104 and the selective polysilicon layer 106.

This selective epitaxial growth comprises two steps of irradiating the substrate under conditions of a substrate temperature of 650° C. and in disilane atmosphere (10 SCCM flow rate) and a pressure of $10^{-3}$ Torr, and then etching the substrate under conditions of a chlorine flow rate of 1 SCCM and a pressure of $10^{-4}$ Torr. By repeating this procedure several times, it is possible to grow an epitaxial layer on the silicon layer and polysilicon on the polysilicon layer, and without growing silicon on the element separating insulating film.

Furthermore, as shown in FIG. 2(c), because the surface of the selective silicon epitaxial layer 105 is higher than the surface of the selective polysilicon layer 106, there is no overhang. As a result, the ion implantation is not blocked. This prevents the formation of a high resistance region in the SD ion implantation for forming the source and drain such that good transistor characteristics are obtained.

Figure 4:
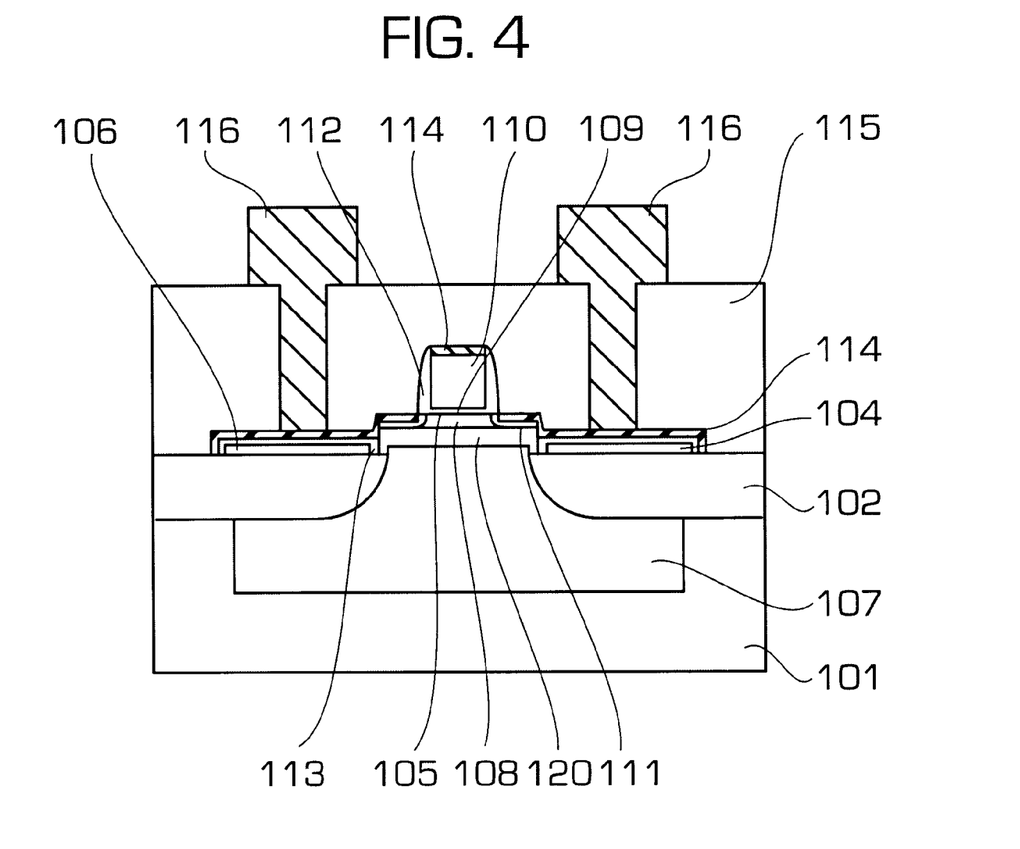
FIG. 4 is a cross sectional view illustrating a second embodiment of the present invention.

A cross sectional structure of a MOS transistor according to a second embodiment of the present invention is described below. FIG. 4 shows a cross sectional structure of the MOS transistor according to the second embodiment of the present invention.

On a silicon substrate 101 of a first conductivity type, a well region 107 of the first conductivity type or an opposite conductivity to the first conductivity type is provided. On a surface of the silicon substrate 101 of the well region 107, MOS transistors are formed, which are electrically separated by an element separating insulating film 102.

On a surface of the silicon substrate 101 of the well region 107, a first selective epitaxial layer 120 and a selective silicon epitaxial layer 105 are provided, and a gate electrode 110 is provided through a gate oxide film 109.

A LDD side wall 112 and a TiSi (titanium silicide) layer 114 are provided on a side surface and an upper surface of the gate electrode 110, respectively.

The selective silicon epitaxial layer 105 is connected to a first polysilicon layer 104 and a selective polysilicon layer 106 which are formed in lamination. The surface of the selective silicon epitaxial layer 105 is higher than or at the same level as the surface of the selective polysilicon layer 106. The selective silicon epitaxial layer 105 includes a channel doped layer 108, a LDD region 111 and source and drain regions 113 of the MOS transistor.

Furthermore, a channel doped layer 108, a LDD region 111 and source and drain regions 113 are formed immediately below the gate electrode 110, immediately below the LDD side wall 112 and between an outside of the LDD side wall 112 and the element separating insulating film, respectively.

Furthermore, the TiSi layer 114 is formed on the surface of the selective polysilicon layer 106, the inter-layer insulating film 115 is formed on the whole surface of the wafer substrate, and contacts provided in the inter-layer insulating film are connected to source and drain electrodes as lead electrodes 116 of the source and drain, respectively.

Figure 5A:
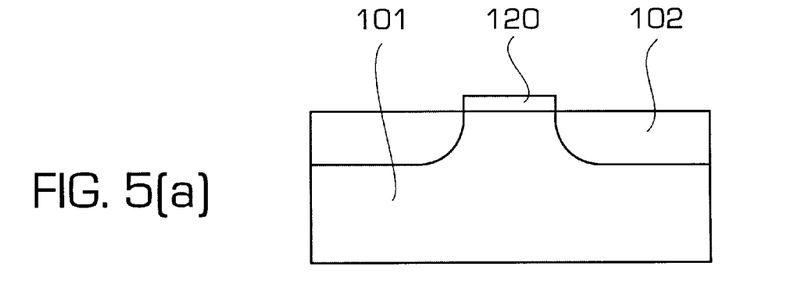
FIGS. 5(a)–5(d) are cross sectional views illustrating the steps for fabricating the transistor shown in FIG. 4.
Figure 5B:
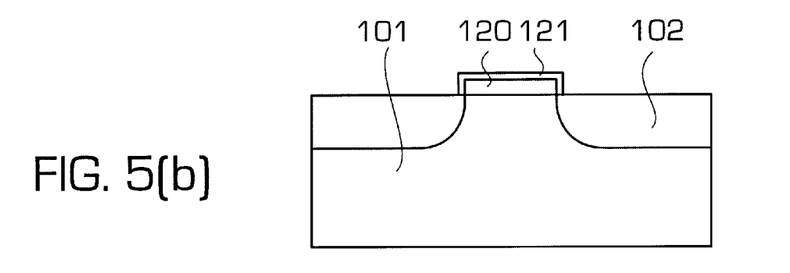
Figure 5C:
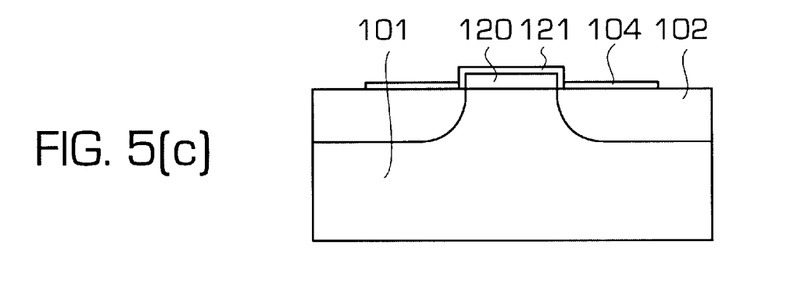

FIGS. 5(a)–5(c) are cross sections of a fabrication method of the MOS transistor according to the second embodiment of the present invention.

First, as shown in FIG. 5(a), the insulating film 102 for separating elements is formed on the silicon substrate 101. Then, the surface of the silicon substrate 101 is exposed, and a first selective silicon epitaxial layer 120 having a thickness of 5~100 nm is formed.

Then, as shown in FIG. 5(b), a first silicon oxide film 121 having thickness of 5–20 nm is formed by oxidation.

Then, as shown in FIG. 5(c), a first polysilicon layer 104 is formed and patterned using a photolithographic technique.

Additionally, the silicon oxide film 121 and the element separating insulating film 102 function as a stopper in etching the first polysilicon layer 104.

Figure 5D:
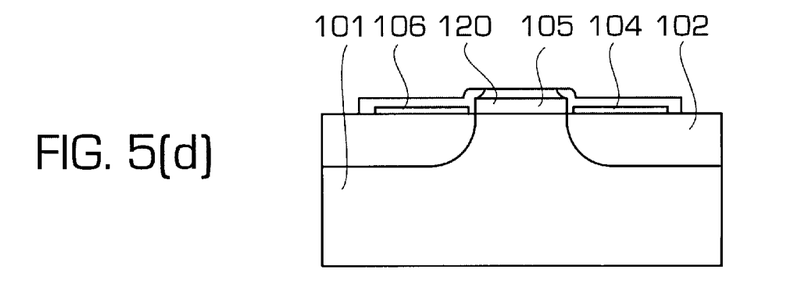

Then, as shown in FIG. 5(d), after the silicon oxide film 121 is removed, for example, by using a wet etching liquid, etc., a selective silicon epitaxial layer 105 is grown on the surface of the silicon substrate 101. In this case, the thickness of the grown film is 30–100 nm, and the selective polysilicon layer 106 is grown on the surface and the periphery of the first polysilicon layer 104. The thickness of the selective polysilicon layer 106 grown on the first polysilicon layer 104 is on the order of ½ to ¼ that of the selective silicon epitaxial layer 105 grown on the silicon substrate 101. It is therefore possible to obtain a structure in which the silicon epitaxial layer 105 selectively grown on the surface of the first selective silicon epitaxial layer 120 is connected to the side surface of the first polysilicon layer 104 and the selective polysilicon layer 106.

Thereafter, it is possible to obtain the cross sectional structure shown in FIG. 4 using techniques well known to those of ordinary skill in the art.

Since, in the second embodiment of the present invention, the first selective layer 120 is grown higher than the wafer surface by the thickness thereof prior to forming the first polysilicon layer 104, it is possible to make the surface of the selective silicon epitaxial layer 105 higher than the surface of the selective polysilicon layer 106. In this manner it is possible to obtain an effect similar to that of the first embodiment.

In a finer MOS, a structure is used which has a delta dope layer for preventing punch-through between the source and drain. In a method for forming the delta dope layer in a case of, for example, an N channel type MOS transistor, a delta dope layer having a sharp impurity profile is formed by implanting arsenide or phosphorous, etc., at an energy of several keV to 30 keV and a dose of $5 \times 10^{12}$ to $2 \times 10^{13}$ cm$^{-2}$. In the second embodiment of the present invention, it is, of course, possible to form a delta dope layer having a sharper impurity profile as compared with the case in which ion implantation is used, by growing the first selective silicon epitaxial layer 120 using an amount of phosphorous or arsenide impurity corresponding to the impurity concentration in the substrate that is obtained by ion implanting a delta dope layer formation.

Figure 12A:
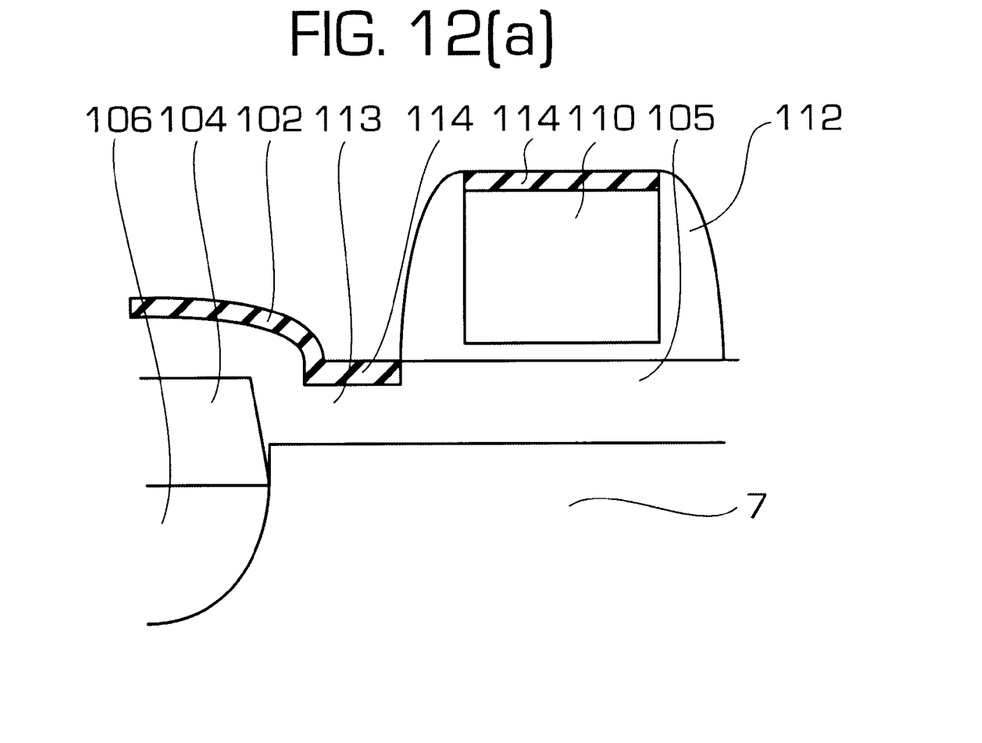
FIG. 12 shows cross sectional views illustrating applied examples of the first and second embodiments of the present invention.
Figure 12B:
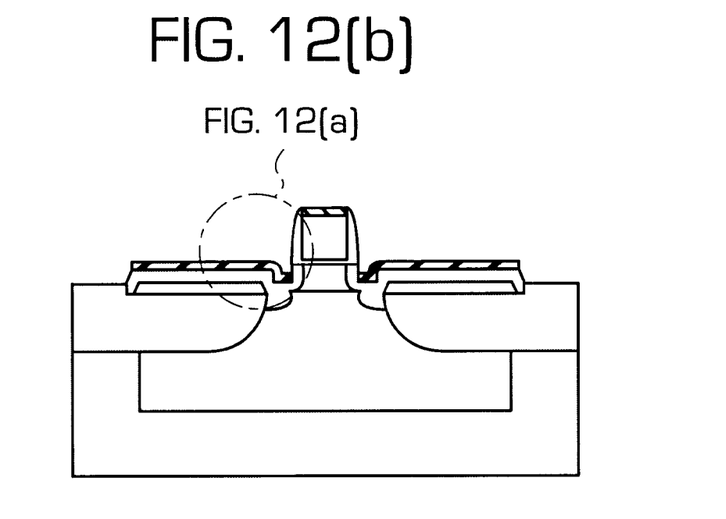

Furthermore, in the first and second embodiments, a structure is shown in which the selective silicon epitaxial layer 105 is connected to the first polysilicon layer 104 and the selective polysilicon layer 106 which are formed in lamination. Also, the surface of the selective silicon epitaxial layer 105 is higher than or at the same level as the surface of the selective polysilicon layer 106. However, it is also possible to prevent the selective polysilicon layer 106 from having an overhanging cross structure even if the surface of the selective epitaxial layer 105 is lower than the surface of the selective polysilicon layer 106 as shown in FIG. 12, as long as the first polysilicon layer 104 prior to growth of the selective silicon epitaxial layer 105 has a tapered edge adjacent to the element region and a cross section such that the bottom of the layer is closer to the element region than the top of the layer. This configuration can be obtained, for example, by isotropic etching, etc.

The effect of the present invention is that good DC MOS transistor characteristics can be obtained with high reproducibility.

A first reason therefor is that by making the surface of the silicon substrate (prior to forming the selective epitaxial layer) higher than the surface of the first polysilicon layer, it is possible to make the surface position of the selective polysilicon layer equal to or lower than the surface position of the selective epitaxial layer after the selective epitaxial layer is formed, to thereby prevent the selective polysilicon layer from assuming an overhanging cross structure.

A second reason therefor is that it is possible to prevent the selective polysilicon layer from having an overhanging cross section even if the surface of the selective silicon epitaxial layer is lower than the surface of the selective polysilicon layer. In this case, the first polysilicon layer is formed having a tapered edge adjacent to the element region and a cross section such that the bottom of the first polysilicon layer is closer to the element region than the top of the layer.

For the above reasons, it is possible to prevent a high resistance region that is otherwise formed when an overhanging portion of the selective polysilicon layer partially blocks the SD ion implantation for forming the source and drain regions.

It should further be apparent to those skilled in the art that various changes in form and detail of the invention as shown and described above may be made. It is intended that such changes be included within the spirit and scope of the claims appended hereto.

What is claimed is:

1. A semiconductor device comprising a semiconductor substrate having thereon
    an element region having a surface,
    an element separating insulating film having an upper surface, adjacent to opposing lateral sides of said element region,
    a silicon epitaxial layer having an upper surface, formed on the surface of said element region,
    a polysilicon layer having an upper surface formed on said element separating film and connected to said silicon epitaxial layer,
    a gate insulating film and a sate electrode formed on said silicon epitaxial layer, and
    impurity doped source and drain regions formed in said silicon epitaxial layer to the sides of the gate electrode and adjacent said element separating film,
    wherein the upper surface of said silicon epitaxial layer is higher than or at the same level as the upper surface of said polysilicon layer and wherein the upper surface of said element separating film is lower than the surface of said element region.

2. The semiconductor device as claimed in claim 1, further comprising a side wall oxide film formed on a side surface of said gate electrode, and said silicon epitaxial layer including a channel doped region below the gate electrode, a LDD region formed below the side wall oxide film of the gate electrode, and source and drain regions formed between an outside edge of the side wall oxide film and the element separating film on opposing lateral sides of said element region.

3. The semiconductor device as claimed in claim 1, wherein a channel doped layer having an impurity concentration high enough to prevent punch-through between the source and drain is provided in the silicon epitaxial layer below said gate electrode.

4. A semiconductor device comprising a semiconductor substrate having thereon
an element region having a surface,
an element separating insulating film having an upper surface, adjacent to opposing lateral sides of said element region,
a silicon enitaxial layer having an upper surface, formed on the surface of said element region,
a polysilicon layer having an upper surface formed on said element separating film and connected to said silicon epitaxial layer,
a gate insulating film and a gate electrode formed on said silicon epitaxial layer, and
impurity doped source and drain regions formed in said silicon epitaxial layer to the sides of the gate electrode and adjacent said element separating film,
wherein the upper surface of said silicon epitaxial layer is higher than or at the same level as the upper surface of said polysilicon layer and
wherein said polysilicon layer comprises a first polysilicon layer formed on the element separating film and a second polysilicon layer formed on said first polysilicon layer.

5. The semiconductor device as claimed in claim 3, wherein said second polysilicon layer is a selective polysilicon layer and said silicon epitaxial layer is a selective silicon epitaxial layer.

6. A semiconductor device comprising a semiconductor substrate having thereon
an element region having a surface,
an element separating insulating film having an upper surface, adjacent to opposing lateral sides of said element region,
a silicon epitaxial layer having an upper surface, formed on the surface of said element region,
a polysilicon layer having an upper surface formed on said element separating film and connected to said silicon epitaxial layer,
a gate insulating film and a gate electrode formed on said silicon epitaxial layer,
impurity doped source and drain regions formed in said silicon epitaxial layer to the sides of the gate electrode and adjacent said element separating film, and
silicide layers formed on an upper surface of said gate electrode, on said polysilicon layer and on said silicon epitaxial layer, and source and drain electrodes each connected to said silicide layer formed on said polysilicon layer at opposing lateral sides of said element region,
wherein the upper surface of said silicon epitaxial layer is higher than or at the same level as the upper surface of said polysilicon layer.

7. A semiconductor device comprising a semiconductor substrate having thereon an element region, an element separating insulating film adjacent to opposing lateral sides of said element region, a first silicon epitaxial layer formed on said element region, a second silicon epitaxial layer having an upper surface, formed on said first silicon epitaxial layer, a polysilicon layer including an upper surface formed on said element separating film and connected to said second silicon epitaxial layer, a gate insulating film and a gate electrode formed on said second silicon epitaxial layer, and impurity doped source and drain regions formed in said second silicon epitaxial layer to the sides of the gate electrode and adjacent said element separating film,
wherein the upper surface of said second silicon epitaxial layer is higher than or at the same level as the upper surface of said polysilicon layer.

8. The semiconductor device as claimed in claim 7, wherein said polysilicon layer comprises a first polysilicon layer formed on the element separating film and a second polysilicon layer formed on said first polysilicon layer.

9. The semiconductor device as claimed in claim 8, wherein said second polysilicon layer is a selective polysilicon layer and said first and second silicon epitaxial layers are selective silicon epitaxial layers.

10. The semiconductor device as claimed in claim 7, further comprising silicide layers formed on an upper surface of said gate electrode, on said polysilicon layer and on said second silicon epitaxial layer, and source and drain electrodes each connected to said silicide layer formed on said polysilicon layer at opposing lateral sides of said element region.

11. The semiconductor device as claimed in claim 7, further comprising a side wall oxide film formed on a side surface of said gate electrode, and said second silicon epitaxial layer including a channel doped region below the gate electrode, a LDD region formed below the side wall oxide film of the gate electrode, and source and drain regions formed between an outside edge of the side wall oxide film and the element separating film on opposing lateral sides of said element region.

12. The semiconductor device as claimed in claim 7, wherein a channel doped layer having an impurity concentration high enough to prevent punch-through between the source and drain is provided in a silicon epitaxial layer below said gate electrode.

13. A semiconductor device comprising a semiconductor substrate having thereon an element region, an element separating insulating film adjacent to opposing lateral sides of said element region, a silicon epitaxial layer having an upper surface formed on said element region, a first polysilicon layer formed on said element separating film, a second polysilicon layer having an upper surface formed on said first polysilicon layer and connected to said silicon epitaxial layer, a gate insulating film and a gate electrode formed on said silicon epitaxial layer, and impurity doped source and drain regions formed in said silicon epitaxial layer,
wherein the upper surface of said silicon epitaxial layer is lower than the upper surface of said second polysilicon layer, the first polysilicon layer has a tapered edge adjacent the element region, and the bottom of the first polysilicon layer is closer to the element region than the top of the first polysilicon layer.

14. The semiconductor device as claimed in claim 13, further comprising silicide layers formed on an upper surface of said gate electrode, on said second polysilicon layer and on said silicon epitaxial layer, and source and drain electrodes each connected to said silicide layer formed on said second polysilicon layer at opposing lateral sides of said element region.

* * * * *